United States Patent [19]
Nakashima et al.

[11] Patent Number: 6,086,699
[45] Date of Patent: Jul. 11, 2000

[54] THIN FILM-FORMING METHOD AND THIN FILM-FORMING APPARATUS THEREFOR

[75] Inventors: Akira Nakashima; Atsushi Tonai; Ryo Muraguchi; Michio Komatsu, all of Kitakyushu; Katsuyuki Machida, Atsugi; Hakaru Kyuragi, Machida; Kazuo Imai, Atsugi, all of Japan

[73] Assignees: Catalysts & Chemicals Industries Co., Ltd.; Nippon Telegraph and Telephone Corporation, both of Japan

[21] Appl. No.: 09/079,112

[22] Filed: May 14, 1998

[30] Foreign Application Priority Data

May 15, 1997 [JP] Japan .................................... 9-125315

[51] Int. Cl.[7] ............................ B32B 33/00; B05D 1/28; B05D 5/00; B05D 7/24; B05D 7/26
[52] U.S. Cl. .......................... 156/230; 156/231; 156/234; 156/238; 156/247; 156/289; 427/407.1; 427/407.2; 427/407.3; 118/257; 118/262
[58] Field of Search ..................................... 156/230, 231, 156/232, 234, 247, 289, 324, 575, 238; 427/407.1, 407.2, 407.3, 428, 152; 118/244, 257, 262; 355/47

[56] References Cited

U.S. PATENT DOCUMENTS

| | | | |
|---|---|---|---|
| 3,937,572 | 2/1976 | Gaynor et al. | 355/16 |
| 4,027,964 | 6/1977 | Fantuzzo et al. | 355/10 |
| 5,421,945 | 6/1995 | Schwartz | 156/234 |
| 5,434,657 | 7/1995 | Berkes et al. | 355/273 |
| 5,747,107 | 5/1998 | Bayer, Jr. et al. | 427/208.4 |

OTHER PUBLICATIONS

"A Novel Planar Multilevel Interconnection Technology Utilizing Polyimide", K. Sato et al., IEEE Trans. Part Hybrid Package. PHP–9, 176, Sep. 1973.

"A Planarization Process for Double Metal CMOS Using Spin–on Glass as a Sacrificial Layer", P. Elikins et al., proceeding of 3rd International IEEE VMIC Conf., 100, Jun. 9–10, 1986.

"Planar Interconnection Technology for LSI Fabrication Utilizing Lift–Off Process", K. Ehara et al., J. Electrochem. Soc., vol. 131. No. 2, 419, Feb. 1984.

"Study of Planarized Sputter–Deposited $SiO_2$," C.Y. Ting et al., J. Vac. Sci. Technol. 15, 1105, Feb. 16, 1978.

"$SiO_2$ Planarization Technology with Biasing and Electron Cyclotron Resonance Plasma Deposition for Submicron Interconnections", K. Machida et al., J. Vac. Sci Technol B4, 818, Jul./Aug. 1986.

"Application of Chemical Mechanical Polishing to the Fabrication of VLSI Circuit Interconnections", W.J. Patrick et al., J. Electrochem. Soc., vol. 138, No. 6, Jun. 1991.

*Primary Examiner*—Curtis Mayes
*Assistant Examiner*—J. A. Lorengo
*Attorney, Agent, or Firm*—Webb Ziesenheim Logsdon Orkin & Hanson, P.C.

[57] ABSTRACT

Disclosed is a thin film-forming apparatus comprising a coating liquid feed means 6 for feeding a thin film-forming coating liquid onto a surface of a transfer roll 2, a transfer means 4 including the transfer roll 2 a surface of which is coated with the thin film-forming coating liquid fed from the coating liquid feed means to form a transfer thin film 8, and a substrate conveying means 16 for continuously conveying a substrate 9 under the transfer roll, a surface of said substrate 9 to be provided with a thin film, wherein the transfer means is so fabricated that the transfer roll surface having the transfer thin film thereon is closely contacted with the surface of the substrate conveyed by the substrate conveying means, to transfer the transfer thin film formed on the transfer roll surface to the substrate surface. Also disclosed is a thin film-forming method using the thin film-forming apparatus. By the apparatus and the method, formation of a planar thin film on a substrate such as a semiconductor wafer can be carried out continuously, stably and at a low cost, and quality lowering of the thin film and property change thereof with time caused by adherence of impurities to the thin film or contamination of the thin film with impurities are avoidable. Moreover, the apparatus and the method are applicable to large-sized substrates.

10 Claims, 3 Drawing Sheets

THIN FILM-FORMING METHOD AND THIN FILM-FORMING APPARATUS THEREFOR

FIELD OF THE INVENTION

The present invention relates to a thin film-forming method wherein a film such as a planarized and thinned layer insulating film is formed, on a protruded and depressed surface of a substrate such as a semiconductor wafer. For example, the substrate may be a semiconductor substrate of a multilayer interconnection structure such as an integrated circuit (IC) or large scale integrated circuit (LSI). The invention also relates to a thin film-forming apparatus for the method. More particularly, the invention relates to a method and an apparatus for continuously forming the thin film.

BACKGROUND OF THE INVENTION

As for forming thin films on substrates to produce semiconductor substrates such as IC and LSI, a sputtering process, a chemical vapor phase epitaxy process, a coating process, a plating process, etc. are known. If a proper process is selected from these processes according to the intended purpose, almost satisfactory substrates for producing electronic parts can be obtained.

In semiconductor substrates such as integrated circuit (IC) and large scale integrated circuit (LSI), however, realization of high-density integrated circuits has been made in recent years. On that account, multilayer interconnection technology has become indispensable. In order to realize the multilayer interconnection structure, it is necessary to completely planarize surfaces of layer insulating films formed between wirings.

As typical technology for the planarization, the following processes have been previously proposed.

(1) SOG (Spin-on-Glass) or PIQ (K. Sato, et al., "A Novel Planar Multilevel Interconnection Technology Utilizing Polyimide", IEEE Trans. Part Hybrid Package, PHP-9, 176 (1973), (2) Etch back process (P. Elikins, et al., "A Planarization Process for Double Metal CMOS Using Spin-on Glass as A Sacrificial Layer", proceeding of 3rd International IEEE VMIC Conf., 100 (1986), (3) Lift-off process (K. Ehara, et al., "Planar Interconnection Technology for LSI Fabrication Utilizing Lift-off Process", J. Electrochem. Soc., vol. 131, No. 2, 419 (1984), (4) Bias sputtering process (C. Y. Ting, et al., "Study of Planarized Sputter-Deposited-$SiO_2$", J. Vac. Sci. Tecnol. 15, 1105 (1978), Bias ECR process (K. Machida, et al., "$SiO_2$ Planarization Technology with Biasing and Electron Cyclotron Resonance Plasma Deposition for Submicron Interconnections", J. Vac. Sci. Technol. B4, 818 (1986), and (5) Abrasion process (W. J. Patrick, et al., "Application of Chemical Mechanical Polishing to the Fabrication of VLSI Circuit Interconnections", J. Electrochem. Soc., Vol. 138, No. 6, June, 1778 (1991).

Referring to the SOG (1), a SOG material comprising a coating liquid containing alkoxysilane such as $Si(OR)_4$ is applied onto a surface of a semiconductor substrate and then hardened by heating to form a planar film. In the SOG, the coating liquid is applied onto a substrate by spin coating, so that there exists a problem of safety or control of the coating liquid. Further, lowering of hot carrier resistance of MOS transistor caused by water content in the SOG film has been reported recently, and control of the water content has become a problem. Furthermore, since this process utilizes flowability of a coating, it is difficult to obtain a completely planar thin film.

The etch back process (2) is most widely used. This process, however, has a problem of occurrence of dust because a resist and an insulating film are etched at the same time. Therefore, this process is not easy in the dust control.

The lift-off process (3) has a problem of impossibility of lift off because a stencil material used is not completely dissolved in the lift-off stage. Because of insufficient controllability and yield, this process has not been practically used yet.

In the bias sputtering process and bias ECR process (4), film formation is made by sputtering or an ECR plasma CVD method. Additionally, RF bias is applied to produce sputtering on the substrate, and the protruded part is etched utilizing angle dependence of the sputtering to perform film formation, whereby planarization of the film is realized. The films obtained by these processes have high quality even if they are formed at a low temperature, and the planarization process is easy and simple. In these processes, however, the throughput is low and the elements may be damaged.

In the abrasion process (5), good planarity can be obtained, but an insulating film of high quality is necessary for the abrasion at a low temperature because an insulating film of poor quality cannot exhibit good abrasion properties. Moreover, because of unstable abrasion properties, a homogeneous thin film may be rarely obtained.

In the existing circumstances, diameters of semiconductor substrates (wafers) are becoming larger and larger, for example, from 8 inches to 12 inches. However, if the processes (1) to (5) are applied to the semiconductor substrates of large diameters, the controllability is insufficient, and it is difficult to ensure planarity of film and uniformity of film thickness.

The present invention has been made to solve such problems associated with the prior art as mentioned above, and it is an object of the invention to provide a continuous thin film-forming method, by which formation of a planar thin film on a substrate such as a semiconductor wafer can be carried out continuously, stably and at a low cost. In this method, quality lowering of the thin film and property change thereof with time, caused by adherence of impurities to the thin film or contamination of the thin film with impurities, are avoidable. Furthermore, this method is applicable to a large-sized substrate. It is another object of the invention to provide a thin film-forming apparatus for the method.

SUMMARY OF THE INVENTION

The thin film-forming method of the present invention is a thin film-forming method for continuously forming a thin film on a surface of a substrate, comprising:

a transfer thin film-forming step of applying a thin film-forming coating liquid to a continuously exposed surface of a thin film transfer base, to continuously form a transfer thin film on the thin film transfer base surface, a substrate feed step of continuously feeding a substrate onto the transfer base surface having the transfer thin film thereon, a surface of said substrate being to be provided with a thin film, and a transfer step of contacting the transfer base surface having the transfer thin film thereon with the substrate surface which is to be provided with the thin film, to continuously transfer the transfer thin film formed on the transfer base surface to the substrate surface.

The thin film-forming apparatus of the present invention is a thin film-forming apparatus for continuously forming a thin film on a surface of a substrate, comprising:

a coating liquid feed means for feeding a thin film-forming coating liquid onto a surface of a transfer roll, a transfer means including the transfer roll a surface which is coated with the thin film-forming coating liquid fed from the coating liquid feed means to form a transfer thin film, and a substrate conveying means for continuously conveying a substrate under the transfer roll, a surface of said substrate being to be provided with a thin film, wherein the transfer means is so fabricated that the transfer roll surface having the transfer thin film thereon is contacted with the surface of the substrate conveyed by the substrate conveying means, to transfer the transfer thin film formed on the transfer roll surface to the substrate surface.

The other thin film-forming apparatus of the present invention is a thin film-forming apparatus for continuously forming a thin film on a surface of a substrate, comprising:

a sheet feed means for continuously feeding a sheet film, a coating liquid application means for applying a thin film-forming coating liquid to a surface of the sheet film fed, to form a transfer thin film, a substrate conveying means for continuously conveying a substrate under the sheet film, a surface of said substrate being to be provided with a thin film, a transfer means including a transfer roll for contacting the sheet film surface having the transfer thin film thereon, with the substrate surface which is to be provided with a thin film, to transfer the transfer thin film formed on the sheet film surface to the substrate surface, and a sheet recovery means for taking up the sheet film after the transferring.

By the above construction, the thin film-forming coating liquid is applied to the surface of the thin film transfer base such as a transfer roll or a sheet film to form a transfer thin film, and the transfer thin film is closely contacted with the substrate surface, whereby the transfer thin film can be continuously transferred to the substrate surface. Accordingly, it is feasible to form a homogeneous planar thin film continuously and stably, and it becomes feasible to form a thin film without being influenced by the size of the substrate. Moreover, quality lowering of the thin film and property change thereof with time caused by adherence of impurities to the thin film or contamination of the thin film with impurities are avoidable.

In the present invention, it is preferable that a release agent application step wherein a release agent such as a silica sol is applied to the surface of the thin film transfer base such as a transfer roll or a sheet film by the use of a release agent application means is provided prior to the transfer thin film-forming step, in consideration of increase of the transfer effect.

In the present invention, further, it is preferable that the transfer thin film formed on the surface of the thin film transfer base such as a transfer roll or a sheet film is heated prior to the transfer step and maintained at a temperature of 80 to 120° C. during the transfer step to decrease the viscosity and to perform transferring. Because the film reflows and spreads out owing to the heat and load given in the transfer step, the protruded and depressed surface of the semiconductor substrate is highly planarized. In this case, not only heating by the use of a heating roll but also external heating such as warm air heating or infrared heating is available.

DETAILED DESCRIPTION OF THE INVENTION

The embodiments of the invention are described below with reference to the attached drawings.

Figure 1:
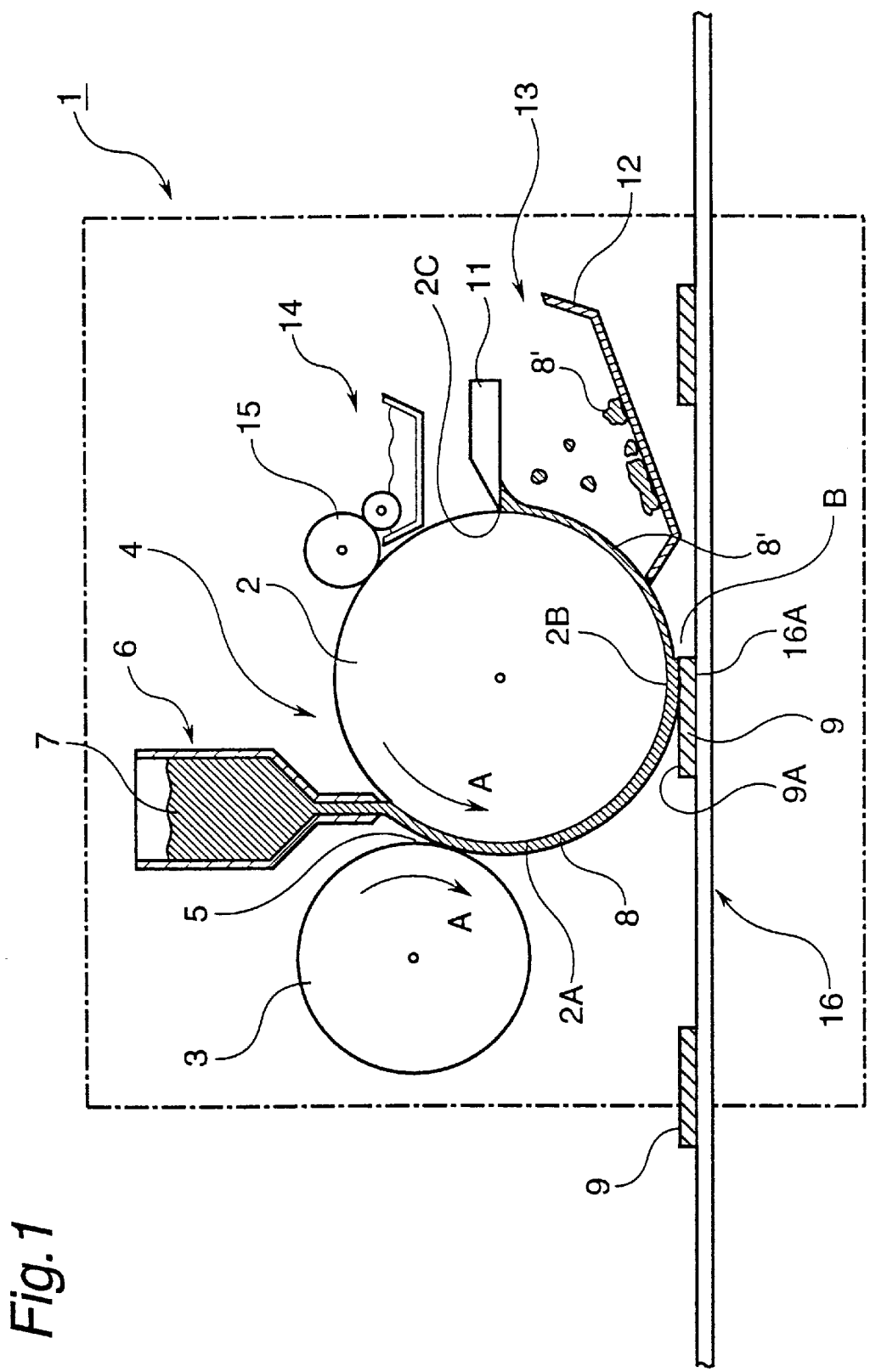
FIG. 1 is a schematic constructional view illustrating a first embodiment of the thin film-forming method of the invention and the thin film-forming apparatus of the invention.

FIG. 1 is a schematic constructional view illustrating the thin film-forming method of the invention and a first embodiment of the thin film-forming apparatus of the invention.

Referring to FIG. 1, numeral 1 designates the whole thin film-forming apparatus of the invention. The thin film-forming apparatus 1 includes a transfer means 4 comprising a pair of rolls, i.e., one transfer roll 2 and one nip roll 3. Above a roll gap 5 between the rolls 2, 3, a coating liquid feed means 6 in the T-die form is arranged. In the coating liquid feed means 6, a thin film-forming coating liquid 7 is contained, and a constant amount of the thin film-forming coating liquid 7 is dropped on a surface of the transfer roll 2 and passes through the roll gap 5 between the rolls 2, 3, whereby a transfer thin film 8 having a constant thickness is formed on a surface 2A of the transfer roll 2. The rolls 2, 3 are so designed that they are each rotated at a constant rate in the direction indicated by each arrow A in FIG. 1.

To easily form and peel the transfer thin film 8, the surface of the transfer roll 2 is preferably made of resins such as acrylic resins, polycarbonate resins, polyolefin resins, vinyl resins, polyimide resins and fluoro resins. For example, a metal roll, a surface of which is covered with any of these resins, is employable as the transfer roll. Though the thickness of the transfer thin film 8 formed on the surface 2A of the transfer roll 2 depends on the intended use of the substrate, it is desirably in the range of 0.3 to 5 μm, preferably 0.5 to 2 μm, in consideration of the transfer effect.

In order to evaporate an organic solvent contained in the thin film-forming coating liquid so as to inhibit production of bubbles in the transfer step, the transfer thin film 8 formed on the surface 2A of the transfer roll 2 is heated to a temperature of 80 to 120° C. by the transfer roll 2 which per se serves as a heating roll. Though the transfer thin film 8 can be heated by the transfer roll 2 serving as a heating roll as shown in this embodiment, it may be externally heated using a proper method such as warm air heating or infrared heating.

Below the transfer means 4, a conveying means 16 comprising a belt conveyor 16 or the like is arranged, and a substrate 9 such as a semiconductor wafer is conveyed at a constant interval and a constant rate in the direction of left side to right side of FIG. 1. The conveying means 16 is so designed that the conveying rate can be adjusted correspondingly to the rotational speed of the transfer roll 2.

Figure 3:
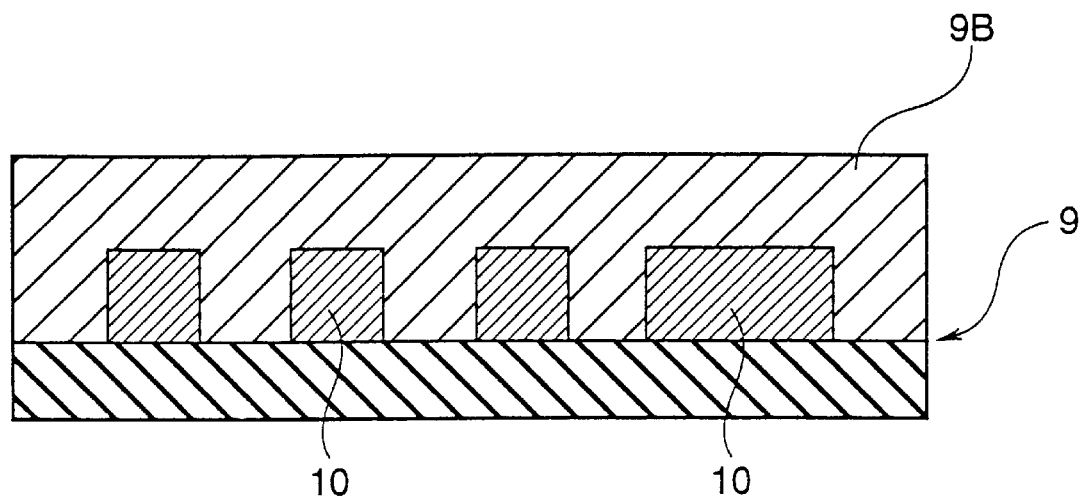
FIG. 3 is a sectional view of a semiconductor substrate on which a thin film serving as an insulating film is formed by the thin film-forming method of the invention.

When the substrate 9 conveyed just under the transfer roll 2 by the conveying means 16 passes through a gap B between a lower edge 2B of the transfer roll 2 and an upper surface 16A of the conveying means 16, the substrate 9 is pressed downward by the transfer roll 2, and thereby the transfer thin film 8 formed on the surface 2A of the transfer roll 2 is transferred to an upper surface of 9A of the substrate 9. As a result, a planarized thin film 9B is formed on the upper surface 9A of the substrate 9, as shown in FIG. 3. In FIG. 3, numeral 10 designates electrode wiring such as aluminum. The substrate 9 having the thin film 9B thereon is then appropriately conveyed to the next step by the conveying means 16. Though the thickness of the thin film 9B thus transferred depends on the intended use of the substrate, it is desirably adjusted to 0.3 to 5 μm preferably 0.5 to 2 μm, by properly selecting the thickness of the transfer thin film 8, the pressing force and the width of the gap B.

The gap between the lower edge 2B of the transfer roll 2 of the transfer means 4 and the upper surface 16A of the conveying means 16 can be finely adjusted so as to be suited to the thickness of the substrate 9. In the transferring, it is preferable that the aforesaid heating temperature is maintained and the pressing time is in the range of 5 to 15 minutes, in consideration of the transfer effect, as described later.

At the position 2C on the backside of the transfer roll 2, a peeling means 13 comprising a scraper 11 and a receiving tray member 12 is arranged. After the transfer thin film 8 is transferred to the surface of the substrate 9, a transfer thin film 8' remaining on the surface 2A of the transfer roll 2 is peeled from the surface 2A, let fall on the receiving tray member 12 and recovered. It is desired to provide a suction means for sucking and removing the thin film which is peeled in the recovery step.

Before the thin film-forming coating liquid 7 is dropped on the surface of the transfer roll 2 by the coating liquid feed means 6 to form the transfer thin film 8, a release agent such as a silica sol can be optionally applied to the surface of the transfer roll 2 by the use of a release agent application means 14 including a roll coater 15, to accelerate the transferring, as shown in FIG. 1.

The thin film-forming coating liquid 7 for use in the invention is preferably a silica type film-forming coating liquid containing polysilazane having recurring units represented by the following formula [I]:

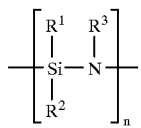

[I]

wherein $R^1$, $R^2$ and $R^3$ may be the same or different and are each a hydrogen atom, an alkyl group of 1 to 8 carbon atoms, an aryl group or an alkoxy group, and n is an integer of 1 or greater.

As the polysilazane, inorganic polysilazane wherein $R^1$, $R^2$ and $R^3$ are all hydrogen atoms is preferable. The polysilazane desirably has a number-average molecular weight of 500 to 50,000, preferably 1,000 to 10,000.

The silica type film-forming coating liquid for use in the invention is obtained by dissolving the polysilazane having recurring units represented by the formula [I] in an organic solvent. Examples of the organic solvents include aromatic hydrocarbons, such as toluene and xylene; and halogenated hydrocarbons, such as chloroform. In the silica type film-forming coating liquid, the polysilazane having recurring units represented by the formula [I] is desirably contained in an amount of 5 to 50% by weight, preferably 10 to 30% by weight, in terms concentration of solid content.

In the present invention, in order to planarize the film utilizing reflow properties given by viscosity decrease of the transfer thin film 8 containing the polysilazane, the transfer thin film 8 is heated to a temperature of 80 to 120° C. to decrease its viscosity and transferred in the transfer step. If the transfer thin film 8 is transferred to the semiconductor substrate 9 in this way, the film reflows and spreads out owing to the head and load given during the transferring, and thereby the protruded and depressed surface of the semiconductor substrate is highly planarized.

Figure 2:
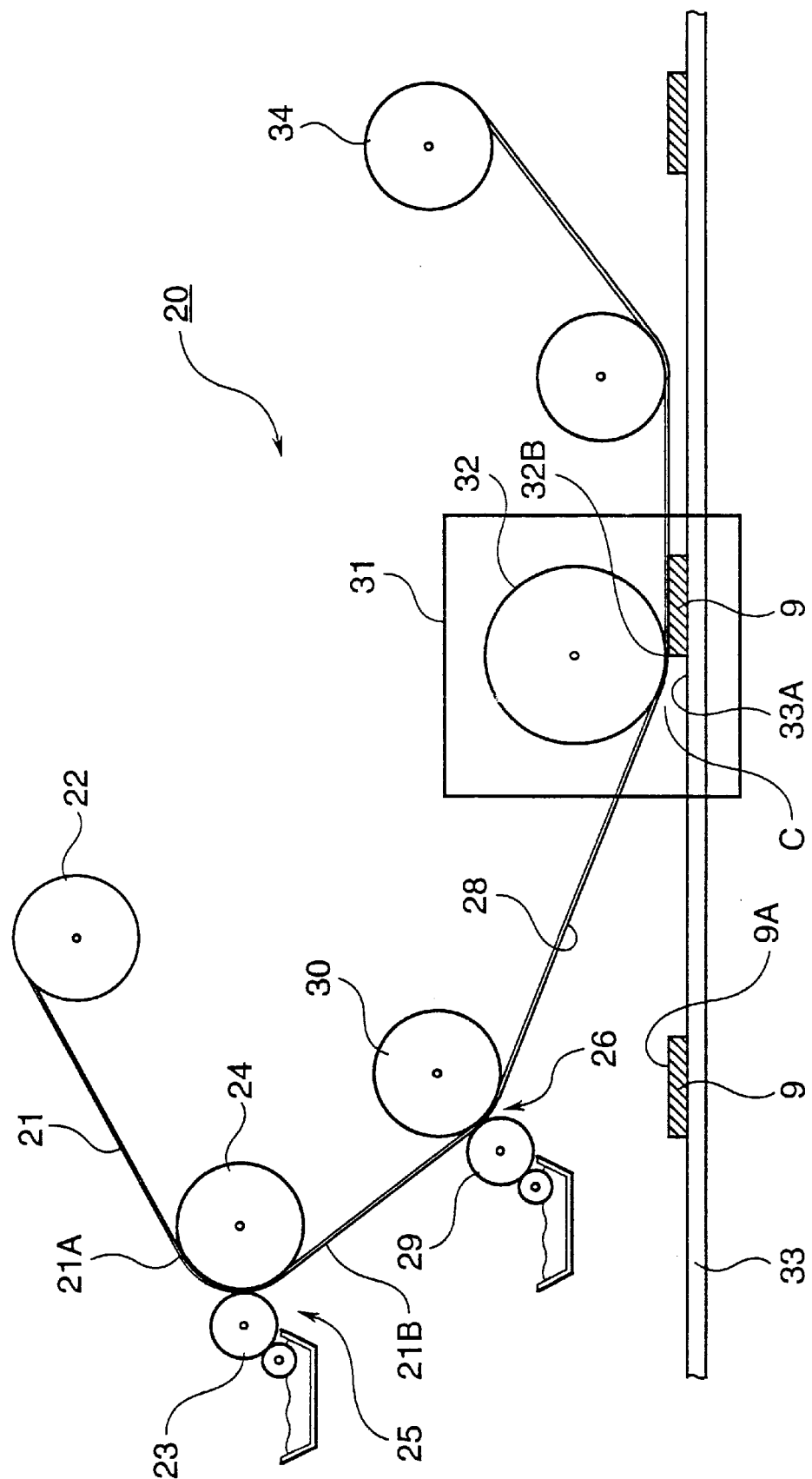
FIG. 2 is a schematic constructional view illustrating a second embodiment of the thin film-forming method of the invention and the thin film-forming apparatus of the invention.

FIG. 2 is a schematic constructional view illustrating a second embodiment of the thin film-forming method of the invention and the thin film-forming apparatus of the invention.

Referring to FIG. 2, numeral 20 designates the whole thin film-forming apparatus of the invention. The thin film-forming apparatus 20 includes a feed roll 22 that is a sheet feed means for continuously feeding, at a constant rate, a sheet film 21 made of a synthetic resin and wound in the form of a roll. This apparatus is so fabricated that a release agent such as a silica sol is applied to a surface 21A of the sheet film fed from the feed roll 22 by a release agent application means 25 comprising a roll coater 23 and a guide roll 24. The step of applying the release agent by the release agent application means 25 can be appropriately omitted, if a film of good releasability such as a film of Teflon resin that is a polyfluoroethylene type resin is used as the synthetic resin sheet film 21.

As the synthetic resin sheet film 21, not only a Teflon resin film but also a film of polyimide or PET is employable. The thickness of the sheet film 21 is preferably 50 to 500 μm in consideration of workability.

The surface 21B of the sheet film 21, which has been coated with the release agent, is then coated with a film-forming coating liquid 27 by a coating liquid application means 26 to form a transfer thin film 28 having a given thickness.

The coating liquid application means 26 comprises a roll coater 29 and a heating roll 30. In order to evaporate an organic solvent contained in the thin film-forming coating liquid so as to inhibit production of bubbles in the transfer step, the transfer thin film 28 is heated to a temperature of 80 to 120° C. by the heating roll 30. Though the transfer thin film 28 can be heated by the heating roll 30 as shown in this embodiment, it may be externally heated using a proper method such as infrared heating.

The sheet film 21 having the transfer thin film 28 formed by the coating liquid application means 26 is then led to a transfer roll 32 placed in a transfer means 31 which is kept to have a given degree of vacuum by differential exhaust.

The thin film-forming apparatus 20 includes a conveying means 33 comprising a belt conveyor or the like, and a substrate 9 such as a semiconductor wafer is conveyed at a constant interval and a constant rate in the direction of left side to right side of FIG. 2 through the transfer means 31. The conveying means 33 is so designed that the conveying rate can be adjusted correspondingly to the feed rate of the feed roll 22.

When the substrate 9 conveyed just under the transfer roll 32 arranged in the transfer means 31 passes through a gap C between a lower edge 32B of the transfer roll 32 and an upper surface 33A of the conveying means 33, the substrate 9 is pressed downward by the transfer roll 32, and thereby the transfer thin film 28 formed on the surface 21B of the sheet film 21 is transferred to an upper surface 9A of the substrate 9. As a result, a planarized thin film 9B is formed on the upper surface 9A of the substrate 9, as shown in FIG. 3. The substrate 9 having the thin film 9B thereon is then appropriately conveyed to the next step by the conveying means 33.

Also in this case, the gap between the lower edge 32B of the transfer roll 32 of the transfer means 31 and the upper surface 33A of the conveying means 33 can be finely adjusted so as to be suited to the thickness of the substrate 9. In the transferring, it is preferable that the aforesaid heating temperature is maintained and the pressing time is in the range of 5 to 15 minutes, in consideration of the transfer effect, as previously described.

The sheet film 21 which has passed through the transfer means 31 is taken up by a take-up roll 34 of a film recovery means.

In the present invention, by virtue of the above construction, the thin film-forming coating liquid is applied to the surface of the thin film transfer base such as a transfer roll or a sheet film to form a transfer thin film, and the transfer thin film is contacted closely with the surface of the substrate, whereby the transfer thin film can be continuously transferred to the substrate surface. Therefore, the invention is an extremely excellent invention exerting the following characteristic remarkable functions and effects.

(1) The transfer thin film-forming step and the transfer step can be continuously carried out, so that adherence of impurities to the thin film or contamination of the thin film with impurities can be inhibited, and therefore quality lowering of the thin film and property change thereof with time are avoidable.

(2) A homogeneous planar thin film can be continuously and stably formed, and therefore decrease of costs can be accomplished.

(3) A thin film can be formed without being influenced by the size of the substrate, and the invention can be applied to the recent semiconductor wafers of large sizes.

(4) A film such as a planarized and thinned layer insulating film can be continuously formed, on a protruded and depressed surface of a semiconductor substrate having a multilayer interconnection structure.

(5) The invention is widely applicable to not only semiconductor substrates but also substrates relating to electronic parts such as those of mounting parts and those of liquid crystal parts (e.g., liquid crystal panel).

What is claimed is:

1. A thin film-forming method for continuously forming a planarized thin film on a protruded and depressed surface of a substrate, said substrate having electronic parts, comprising:

a transfer thin film-forming step of applying a thin film-forming coating liquid to a continuously exposed surface of a thin film transfer base, to continuously form a transfer thin film on the thin film transfer base surface, a substrate feed step of continuously feeding a substrate having electronic parts onto the transfer base surface having the transfer thin film thereon, a protruded and depressed surface of said substrate being provided with a planarized thin film, and a transfer step of contacting the transfer base surface having the transfer thin film thereon with the substrate surface which is to be provided with the thin film, to continuously transfer the transfer thin film formed on the transfer base surface to the substrate surface.

2. The thin film-forming method as claimed in claim 1, further comprising, after the transfer step, a step of peeling the transfer thin film remaining on the transfer base surface, from said surface.

3. The thin film-forming method as claimed in claim 1, wherein the continuously exposed surface of the thin film transfer base is a surface of a transfer roll.

4. The thin film-forming method as claimed in claim 1, wherein the continuously exposed surface of the thin film transfer base is a surface of a sheet film continuously fed.

5. The thin film-forming method as claimed in claim 1, further comprising, before the transfer thin film-forming step, a release agent application step of applying a release agent to the thin film transfer base surface.

6. The thin film-forming method as claimed in claim 2, wherein the continuously exposed surface of the thin film transfer base is a surface of a transfer roll.

7. The thin film-forming method as claimed in claim 2, wherein the continuously exposed surface of the thin film transfer base is a surface of a sheet film continuously fed.

8. The thin film-forming method as claimed in claim 1, wherein the transfer thin film-forming step is operated under a decompressed condition.

9. The thin film-forming method as claimed in claim 1, wherein the thin film-forming coating liquid is a silica type coating liquid.

10. The thin film-forming method as claimed in claim 1, wherein the substrate with a protruded and depressed surface is a substrate for a semiconductor wafer or a liquid crystal panel.

* * * * *

UNITED STATES PATENT AND TRADEMARK OFFICE
CERTIFICATE OF CORRECTION

PATENT NO. : 6,086,699
DATED : July 11, 2000
INVENTOR(S) : Akira Nakashima et al.

It is certified that error appears in the above-identified patent and that said Letters Patent is hereby corrected as shown below:

Column 1 Line 13 "to-a" should read --to a--.

Signed and Sealed this

Seventeenth Day of April, 2001

Attest:

NICHOLAS P. GODICI

Attesting Officer     Acting Director of the United States Patent and Trademark Office